United States Patent
Levy et al.

(10) Patent No.: US 8,934,315 B2
(45) Date of Patent: Jan. 13, 2015

(54) MEMORY DEVICE AND METHOD FOR SENSING A CONTENT OF A MEMORY CELL

(75) Inventors: Ido Levy, Peduel (IL); Lior Aviv, Hertzelia (IL); Eyal Hartmann, Haifa (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/502,378

(22) PCT Filed: Nov. 12, 2009

(86) PCT No.: PCT/IB2009/055041
§ 371 (c)(1),
(2), (4) Date: Apr. 17, 2012

(87) PCT Pub. No.: WO2011/058394
PCT Pub. Date: May 19, 2011

(65) Prior Publication Data
US 2012/0213026 A1    Aug. 23, 2012

(51) Int. Cl.
*G11C 7/06* (2006.01)
*G11C 7/12* (2006.01)

(52) U.S. Cl.
CPC ... *G11C 7/12* (2013.01); *G11C 7/065* (2013.01); *G11C 2207/002* (2013.01); *G11C 2207/005* (2013.01)
USPC .......................................................... 365/207

(58) Field of Classification Search
USPC .......................................................... 365/207
See application file for complete search history.

(56) References Cited

U.S. PATENT DOCUMENTS

| | | |
|---|---|---|
| 5,241,503 A | 8/1993 | Cheng |
| 5,881,005 A * | 3/1999 | Otori et al. ............. 365/205 |
| 6,434,736 B1 * | 8/2002 | Schaecher et al. ........ 716/111 |
| 2001/0002886 A1 | 6/2001 | Ooishi |
| 2004/0125678 A1* | 7/2004 | Sinha et al. ............. 365/207 |
| 2009/0154278 A1 | 6/2009 | Chan-Choi et al. |

OTHER PUBLICATIONS

Sundaram Srikanth et al: "High Speed Robust Current Sense Amplifier for Nanoscale Memories:- A Winner Take All Approach" Proceedings of the 19th International Conference on VLSI Design, IEEE, Jan. 2006, pp. 569-574.
Sinha Manoj et al: "Low Voltage Sensing Techniques and Secondary Design Issues for sub-90nm Caches" European Solid State Circuits Conference, Sep. 2003, pp. 413-416.
International Search Report and Written Opinion correlating to PCT/IB2009/055041 dated Jun. 25, 2010.

* cited by examiner

*Primary Examiner* — Hoai V Ho
*Assistant Examiner* — Jay Radke

(57) ABSTRACT

A memory device to sense a content of a memory cell includes: a pair of bit-lines; a memory cell coupled between the bit-lines; and a sensing circuit. The sensing circuit has at least two inputs for receiving respective currents from a current conveyor, and senses, when operating in a sensing mode, a difference between output currents. The difference between the output currents represents a content of the memory cell. The sensing circuit includes an output for outputting an output signal that represents the content of the memory cell. The current conveyor isolates the sensing circuit from the bit-lines, when the current conveyor is operated in an isolation mode, and has at least two outputs for providing, to the sensing circuit, output currents representing bit-lines currents; and equalizing the output currents before the current conveyor starts to operate in a current conveying mode.

19 Claims, 5 Drawing Sheets

MEMORY DEVICE AND METHOD FOR SENSING A CONTENT OF A MEMORY CELL

FIELD OF THE INVENTION

This invention relates to a memory device and a method for sensing a content of a memory cell, and especially for differential current sensing of the content of a memory cell.

BACKGROUND OF THE INVENTION

Modern memory arrays include a very large number of memory cells that are arranged in columns and rows. Each column is connected via bit-lines to a read circuit and a write circuit. These modern memory arrays are expected to be fast, error free and to consume a minimal amount of power.

However, voltage based sensing is relatively slow, especially in large memory arrays.

Differential current sensing facilitates fast reading of relatively large memory arrays but is error prone, is very sensitive to process variations and noises. It also consumes a large amount of power.

SUMMARY OF THE INVENTION

The present invention provides a method and a memory device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Figure 1:
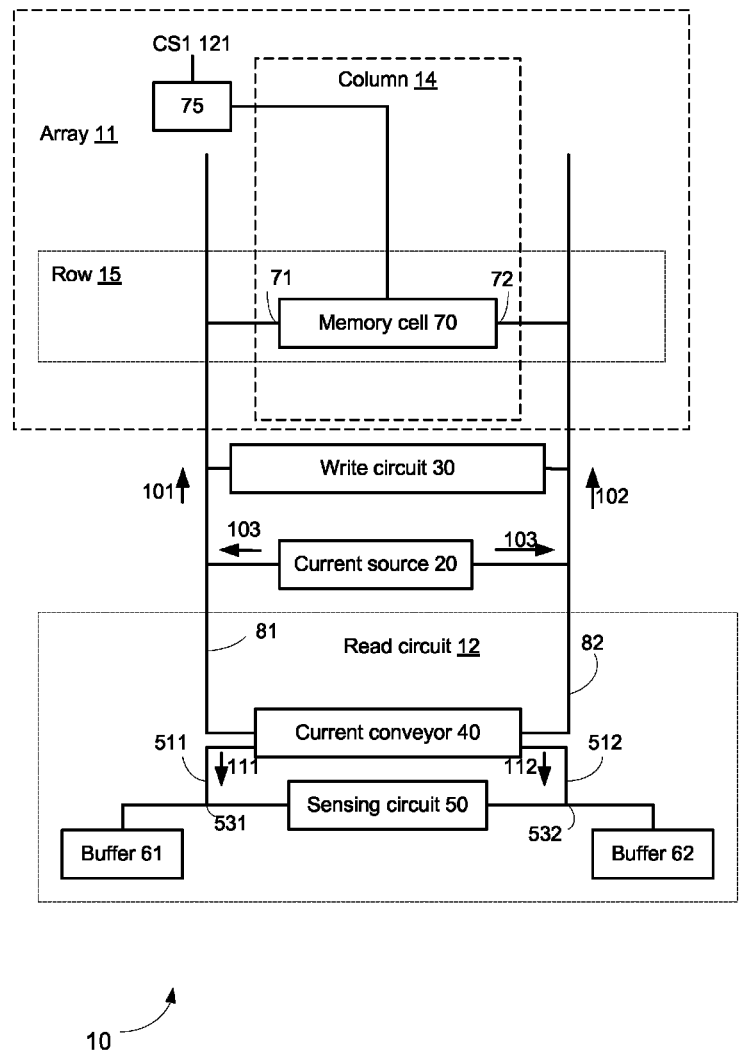
FIG. 1 schematically shows an example of an embodiment of a memory device.

FIG. 1 illustrates an example of an embodiment of a memory device 10. Device 10 includes read circuit 12, write circuit 30, current source 20, memory cell 70, and bit-lines 81 and 82.

The memory device 10 includes array 11 of memory cells. Array 11 includes multiple columns and multiple rows of memory cells, such as column 14 and row 15. Each column is connected to a read circuit (such as read circuit 12) and to a write circuit (such as write circuit 30).

Each row of memory cells is connected to a row select circuit such as row select circuit 75 of FIG. 1. Row select circuit 75 is connected to one or more rows of memory cells—including the row that includes memory cell 70.

Row select circuit 75 can receive one or more control signals that cause the row select circuit 75 to select a row of memory cells. When row select circuit 75 receives an asserted first control signal CS1 121 the row select circuit 75 selects the row that includes memory cell 70. The first control signal CS1 121 is asserted at the beginning of the isolation period. The first control signal 121 is negated after the sensing period ends.

A row of memory cells is activated during each read or write operation.

The read circuit 12 can be configured to operate at different modes—an isolation mode, a current conveying mode and a sensing mode. The read circuit 12 operated in an isolation mode during an isolation period. The read circuit 12 operates in a current conveying mode during a current conveying period. The read circuit 12 operates in a sensing mode during a sensing period.

The read circuit 12 has a sensing circuit 50 that senses the content of the memory cell 70 during the sensing period—when operating at the sensing mode.

The read circuit 12 may also include buffers 61 and 62.

The read circuit 12 also includes a current conveyor 40 that isolates the sensing circuit 50 from the memory cell during the isolation period—when operating at an isolation mode.

The current conveyer 40 isolates the sensing circuit 50 from the memory cell 70 during the isolation period—when operating at the isolation mode. The current conveyor 40 allows output currents to be provided to the sensing circuit 50 during the current conveying period—when operating at a current conveying mode. The output currents reflect bit-line currents that in turn reflect the content of the memory cell 70. When operating in a current conveying mode—during the current conveying period the current conveyor 40 prevents the sensing circuit 50 from sensing differences between the output currents.

The sensing circuit 50 starts to operate at the sensing mode at a point in time (at a predetermined delay from the beginning of the current conveying period) in which a significant difference is expected to develop between the output currents. The difference is significant in the sense that the sensing circuit can sense correct logical values. This point in time (this predetermined delay) can be set in advance (during the design process of the device) and may be based on an expected behaviour of the sensing circuit 50. The expected behaviour can be learned from simulations, current measurements and the like.

The current conveyor 40 is configured to equalize the currents to be output before the current conveying period starts—before the current conveyor 40 enters the current conveying mode. This equalization reduces the chances of erroneous sensing, and minimizes errors induced by residual charges that may result from a previous read operation or a previous write operation.

The memory device 10 has a current source 20 that provides a supply current 103 of a precharge value to the memory cell 70 during the isolation period and before the isolation period begins. The supply current 103 current may be required for setting the bit-lines to a desired value before the sensing process begins. Both bit-lines 81 and 82 that are connected to the memory cell 70 may be set to a high value before each read or write operation.

The current source 20 provides a source current 103 of a second value to the read circuit 12 during the sensing period (while the sensing circuit 50 operated in the sensing mode) and may also provide the source current 103 (having the second value) during the current conveying period (while the current conveyor 40 operated in the current conveying mode). The source current 102 is partially consumed by the memory cell 70. The second value (of the source current 103) may be lower than the precharge value (of the source current) in order to reduce the power consumed by the read circuit 12. The power consumption limitation may also include limiting one or more currents that flow though the sensing circuit.

Write circuit 30, current conveyor 40 and current source 20 are connected (in parallel) between bit-lines 81 and 82. Current conveyor 40 is also connected, via two output lines 511 and 512, to two output nodes 531 and 532 of sensing circuit 50. Output node 531 is connected to output line 511 and output node 532 is connected to output line 512. Buffer 61 is connected to output node 531 while buffer 62 is connected to output node 532.

Memory cell 70 is connected between bit-lines 81 and 82. Memory cell 70 can store a value ("0" or "1") that is also referred to as the content of the memory cell 70. Memory cell 70 may be a latch that has two ends 71 and 72. End 71 is connected to first bit-line 81. End 72 is connected to second bit-line 82. Accordingly—memory cell 70 is connected between first and second bit-lines 81 and 82. The content of the latch may be the value provided at one of end 71 and 72.

Write circuit 30 writes a value to memory cell 70 using bit lines 81 and 82. The content of memory cell 70 is read using bit lines 81 and 82. The difference between bit-line currents 101 and 102 (that flow over bit lines 81 and 82) reflects the content of memory cell 70. Alternatively, the value of one bit-line current may reflect the content of memory cell 70.

Current source 20 provides, during the isolation period, a source current 103 having a precharge value to memory cell 70.

Current source 20 may output a source current 103 to each of the bit lines 81 and 82. In each of the bit lines 81 and 82 the source current 103 can be distributed between the memory cell 70 and the read circuit 12. At least some of the source current 103 is directed towards the read circuit 12 during the isolation period, sensing period and current conveying period.

A first output current 111 flows over first output line 511 towards read circuit 12 and has a value that equals a difference between source current 103 and first bit-line current 101. A second output current 112 flows over second output line 512 towards read circuit 12 and has a value that equals a difference between source current 103 and second bit-line current 102.

First output current 111 represents first bit-line current 101. Second output current 112 represents second bit-line current 102. Source current 103, may for example, equal the sum of first output current 111 and first bit-line current 101. Source current 103 may also equal the sum of second output current 112 and second bit-line current 102.

During the sensing period (when operating in a sensing mode) the sensing circuit 50 senses which output line (out of 511 and 512) conveys a higher output current than the other and which output line conveys a lower output current than the other.

Sensing circuit 50 determines the value of the memory cell based on this sensing. The higher output current is translated by sensing circuit 50 to a high output signal that is conveyed over an output node of sensing circuit 50 to a buffer (out of buffers 61 and 62). The lower output current is translated by sensing circuit 50 to a low output signal that is conveyed over an output node of sensing circuit 50 to a buffer (out of buffers 61 and 62).

Figure 2:
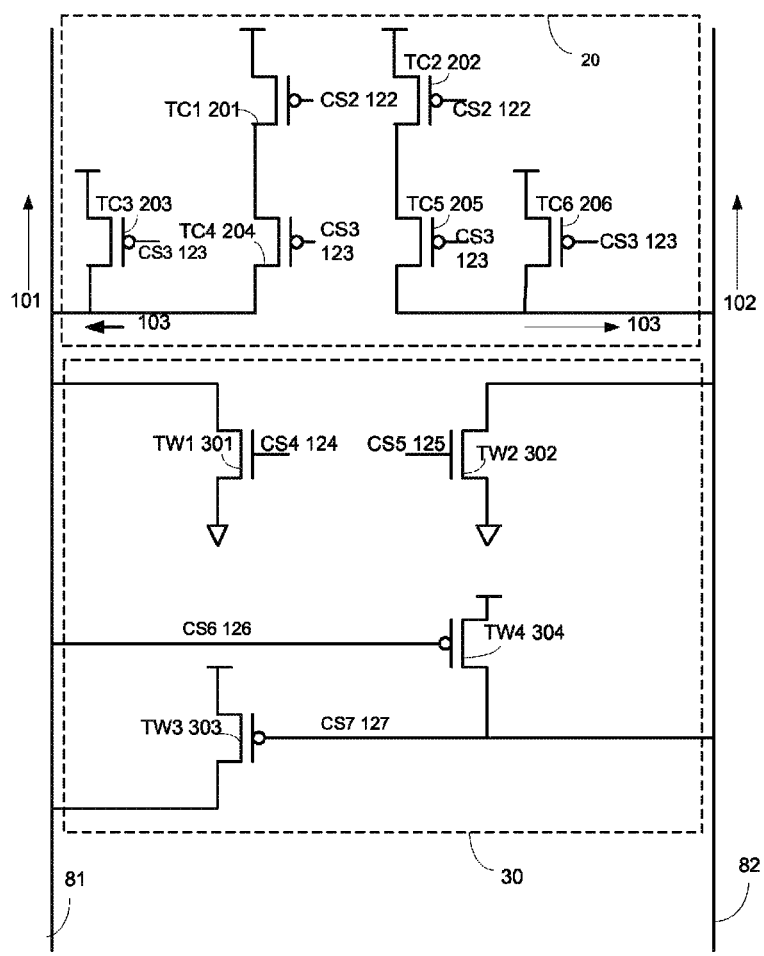
FIG. 2 schematically shows an example of an embodiment of a current source and of a write circuit.

FIG. 2 illustrates an example of an embodiment of current source 20 and of write circuit 30.

Current Source 20

Current source includes six PMOS transistors that are referred to as a first to sixth current source transistors TC1-TC6 201-206.

The sources of TC1 201 and TC2 202 are connected to a supply source and their drains are connected to sources of TC4 204 and TC5 205. The drains of TC3 203 and TC4 204 are connected to first bit-line 81. The sources of TC3 203 and TC6 206 are connected to a supply source. The drains of TC5 205 and TC6 206 are connected to second bit-line 82.

The gates of TC1 201 and TC2 202 receive a second control signal CS2 122. The gates of TC3 203, TC4 204, TC5 205 and TC6 206 receive a third control signal CS3 123.

Control signals CS2 122 and CS3 123 cause the current source 20 to output (towards each bit line 81 and 82) a source current 103 having a precharge value that is higher than the second value of the source current 103. The source current 103 has a precharge value during the isolation period and has the second value during the current conveying period and the sensing period.

CS2 122 is low during the isolation period and is high during the current conveying period and the sensing period. Accordingly, TC1 201 and TC2 202 are "ON" (activated) during the isolation period and are "OFF" (deactivated) during the current conveying period and during the sensing period. The deactivation of TC1 201 and TC2 202 causes TC4 204 and TC5 205 to be deactivated.

The third control signal CS3 123 is low during the isolation period and low during the current conveying period and sensing period. The third control circuit CS3 123 causes each of TC3 203 and TC6 206 to output a source current 103 having a second value during the current conveying period and the sensing period.

TC3 203 and TC6 206 can be designed to provide a larger current than TC4 204 and TC5 205 and can be larger than TC4 204 and TC5 205.

Write Circuit 30

Write circuit 30 includes four transistors that are referred to as first to fourth write circuit transistors TW1 301-TW4 304. In the shown example, TW1 301 and TW2 302 are NMOS transistors, whilst TW3 303 and TW4 304 are PMOS transistors.

TW1 301 receives at its gate a fourth control signal CS4 124 that determines the value that should be written to the first end 71 of memory cell 70. TW2 302 receives at its gate a fifth control signal CS5 125 that determines the value that should be written to second end 72 of memory cell 70.

TW3 303 and TW4 304 prevent write circuit 30 from writing "0" to both bit-lines 81 and 82. The drain of TW3 303 and the gate of TW4 304 are connected to first bit-line 81. The drain of TW4 304 and the gate of TW3 303 are connected to second bit-line 82. If, for example, '0' is written to first bit-line 81 then second bit-line 82 is forced to stay at high voltage level. If, for example, it is desired to write a low level ('0') to the first end 71 of memory cell 70 and write a high level ('1') to the second end 72 of memory cell then during the write operation CS4 124 is set and CS5 125 is reset.

Figure 3:
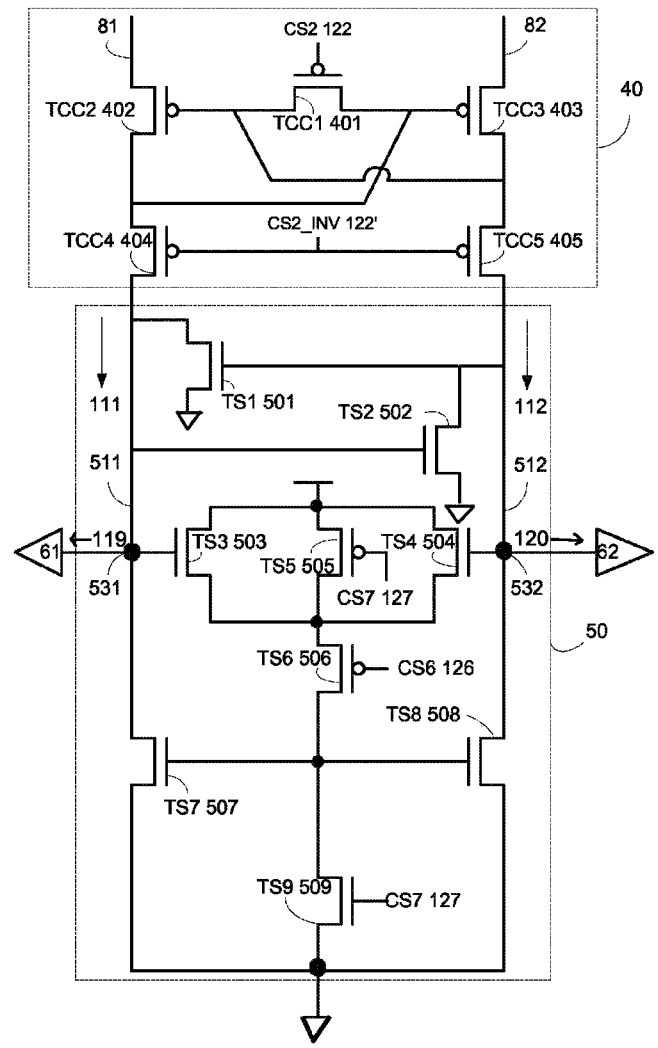
FIG. 3 schematically shows an example of an embodiment of a current conveyor and of a sensing circuit.

FIG. 3 illustrates an example of an embodiment of current conveyor 40 and of sensing circuit 50.

Current Conveyor 40

Current conveyor 40 includes five transistors that are referred to as first to fifth current conveyor transistors TCC1 401, TCC2 402, TCC3 403, TCC4 404 and TCC5 405. In this example, the current conveyor transistors are PMOS transistors.

TCC2 402 and TCC3 403 are current conveying transistors that may provide output currents to the sensing circuit 50. TCC4 404 and TCC5 405 are isolation transistors for isolating the sensing circuit 50 from bit-lines 81 and 82 during the isolation period.

TCC1 401 is an equalizer that is coupled to gates of the current conveying transistors TCC2 402 and TCC3 403. The equalizer (TCC1 401) equalizes the currents to be output before the current conveying period starts.

The gate of TCC1 401 receives a control signal (CS2 122) and the control signal (CS2 INV 122') is an inverted version of the control signal CS2 122. CS2 122 causes TCC1 401 to equalize the gate voltage of TCC2 402 and TCC3 403 during the isolation period. This forces the source drain currents that flow through these transistors to equal each other. When CS2 122 is raised TCC1 401 is deactivated and the gates of TCC2 402 and TCC3 403 are disconnected from each other.

When TCC1 401 is deactivated, TCC2 402 and TCC3 403 operate as a current conveying stage that receive at their sources an output current and provide respective output currents to transistors TCC4 404 and TCC5 405. It is noted that the current conveyor 40 can have an amplifying factor that differs from one and that the output current it outputs to sensing circuit 50 may differ from the current it receives from bit-lines 81 and 82.

The drain of TCC1 401 is connected to the gate of TCC2 402. The source of TCC1 401 is connected to the gate of TCC3 403. The source of TCC2 402 is connected to first bit-line 81. The drain of TCC2 402 is connected to the source of TCC4 404. The source of TCC3 403 is connected to second bit-line 82. The drain of TCC3 403 is connected to the source of TCC5 405. The drain of TCC4 404 is connected to first output line 511. The drain of TCC5 405 is connected to second output line 512.

The gates of TCC5 405 and TCC4 404 receive CS2 INV 122'. CS2 INV 122' causes TCC5 405 and TCC4 404 to be deactivated (OFF) during the isolation period and to prevent sensing circuit 50 from receiving currents from current source 20 or from current conveyor 40 during the isolation period.

Sensing Circuit 50

Sensing circuit 50 includes nine transistors that are referred to as first to ninth sensing circuit transistors TS1-TS9 501-509. In this example, the current conveyor transistors are PMOS transistors.

In this example TS1 501, TS2 502, TS3 503, TS4 504, TS7 507, TS8 508 and TS9 509 are NMOS transistors, whilst TS5 505 and TS6 506 are PMOS transistors.

The sources of TS1 501 and TS2 502 are grounded. The drain of TS1 501 and the gate of TS2 502 are connected to first bit-line 81. The drain of TS2 502 and the gate of TS1 501 are connected to second bit-line 82.

The sources of TS7 507, TS8 508 and TS9 509 are grounded. The gates of TS7 507 and TS8 508 are connected to the drain of TS6 506. The drain of TS6 506 is connected to the drain of TS5 505 and to the sources of TS3 503 and TS4 504.

The source of TS5 505 and the drains of TS3 503 and TS4 504 are connected to a supply voltage.

TS1 501 and TS2 502 are a set of error prevention transistors that prevent both output nodes 531 and 532 of sensing circuit 50 to be at a high voltage level at the end of the sensing period. TS1 and TS2 prevent sensing circuit 50 from sensing "1" on both bit-lines 81 and 82.

TS1 501 and TS2 502 cause the voltage level on one output node to be reset once voltage of the other output node is set.

TS5 505 and TS6 506 form a control branch that maintains the pair of converting transistors (TS7 507 and TS8 508) saturated during a current conveying period that follows the isolation period and precedes the sensing period.

TS6 506 is a current limiter that limits a power consumed by the sensing circuit 50 during the sensing period.

TS6 506 receives at its gate sixth control signal CS6 126 that determines the conductivity of TS6 506—it limits the current that flows through TS6 506. Accordingly—TS6 acts as a current limiter that limits the current consumed by sensing circuit 50 during the sensing period. TS6 506 is active during the entire sensing period and it controls the current that passes through TS6 506 and propagates to other transistors such as TS7 507, TS8 508 and TS9 509. In other words, TS6 506 limits the currents which flow from the voltage supply to the ground.

TS7 507 and TS8 508 form a pair of converting transistors that convert the difference between the output currents 111 and 112 to a difference in voltage levels of two output nodes 531 and 532 of sensing circuit 50. TS7 507 converts output current 111 to a voltage level of output node 531. TS8 508 converts output current 112 to a voltage level of output node 532.

TS7 507, TS8 508 and TS9 509 form a discharge circuit that is configured to discharge the output nodes 531 and 532 in proximity to an end of the sensing period. Once the sensing period ends or is about to end the discharging occurs. When CS7 127 is low is causes the gates of TS7 507 and TS8 508 to be high. This forces the first and second output nodes 531 and 532 to be low. The sensing circuit is maintained in a lower voltage level thus allowing current to flow towards it.

TS9 509 is a control transistor that initiates a sensing of the difference between the output current at a point in time in which the difference between the output currents is expected to exceed a threshold. It receives control signal CS7 127 that activates it at that point of time.

During the current conveying period CS7 127 is negated and it causes TC7 507 to conduct. This causes the drain of TC5 505 to be at a high voltage level. While TS6 506 is conducting this also causes the drain of TS6 506 and the gates of TS7 507 and TS8 508 to be at a high voltage level. This causes TS7 507 and TS8 508 to be saturated and force a low voltage level at both output nodes 531 and 532.

The operation of the sensing circuit 50 will be further clarified by the following example. It is assumed that the first end 71 of memory cell holds a '0' value and the second end 72 of the memory cell 70 holds a '1' value. During the current conveying period and the sensing period the first end 71 drains more current than the second end 72. First bit-line current 101 is stronger than second bit-line current 102 and first output current 111 is stronger than second output current 112. This causes the drain source voltage of TS8 508 (which is the voltage level of second output node 532) to be higher then the drain source voltage of TS7 507 (which is the voltage level of first output node 531). Transistors TS1 501 and TS2 502 assist in decreasing the voltage level of first output node 531.

These voltage levels cause TS4 504 to be more conductive than TC3 503. TS4 504 will provide (via TS6 506) current to the gates of TS7 507 and TS8 508 that will increase the voltage level of these gates and make TS7 507 and TS8 508 more conductive. TS7 507 and TS8 508 have their source connected to the ground and their increased conductivity will force first output node 531 to remain in a low voltage level.

Figure 4:
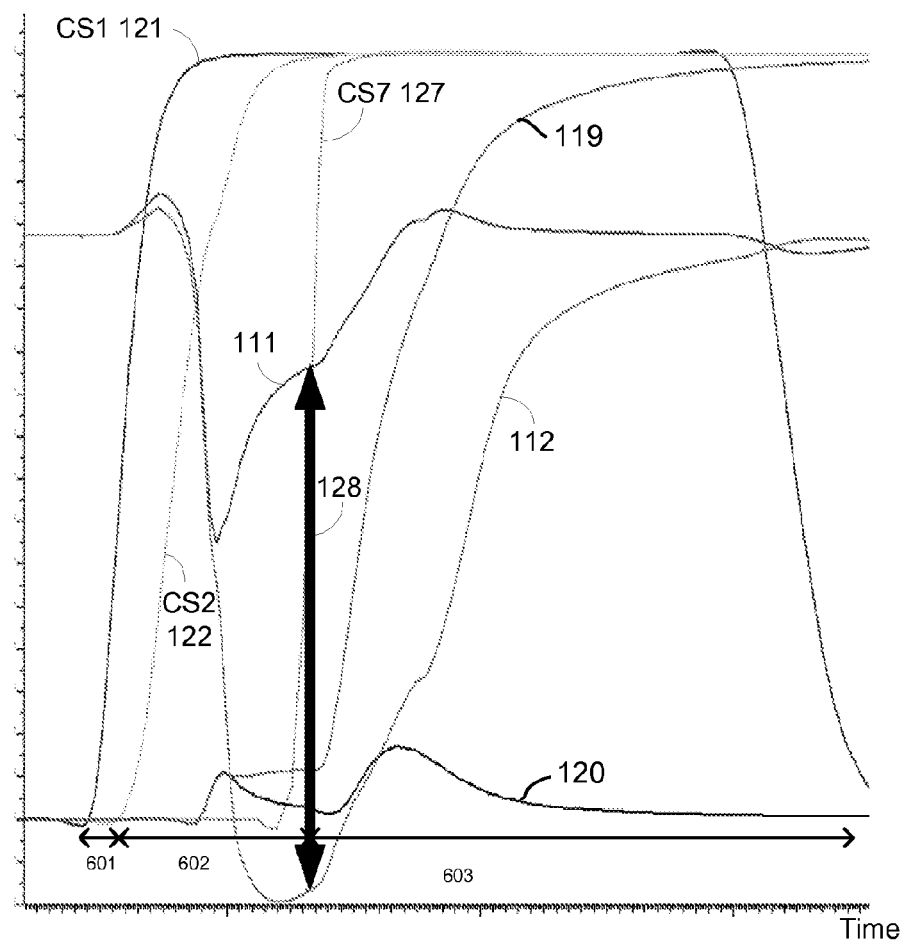
FIG. 4 schematically illustrates an example of an embodiment of control signals, output currents, an isolation period, a current conveying period and a sensing period as a function of time.

FIG. 4 schematically illustrates a graph of control signals CS1 121, CS2 122, CS7 127, output currents 111 and 112, as a function of time.

CS1 121 is asserted at the beginning of isolation period 601. It is negated after sensing period 603 ends. The assertion of CS1 121 results in a selection of one memory cell per column. CS2 122 is asserted at the end of isolation period 601 and at the beginning of current conveying period 602. CS3 123 is asserted at the beginning of the sensing period 603.

FIG. 4 illustrates that at the starting point of the current conveying period 602 both output currents 111 and 112 are equal—due to equalizer TCC1 401. Once the difference (denoted 128) between these currents is meaningful—sufficient to detect a correct logic value—sensing period 603 begins. FIG. 4 also illustrates that at the starting point of the current conveying period 602 both a current 119 provided to buffer 61 and current 120 provided to buffer 62 are equal. However, at the start of the sensing period 603 the current 119 and the current 120 begin to differ.

Method for Sensing a Content of a Memory cell

Figure 5:
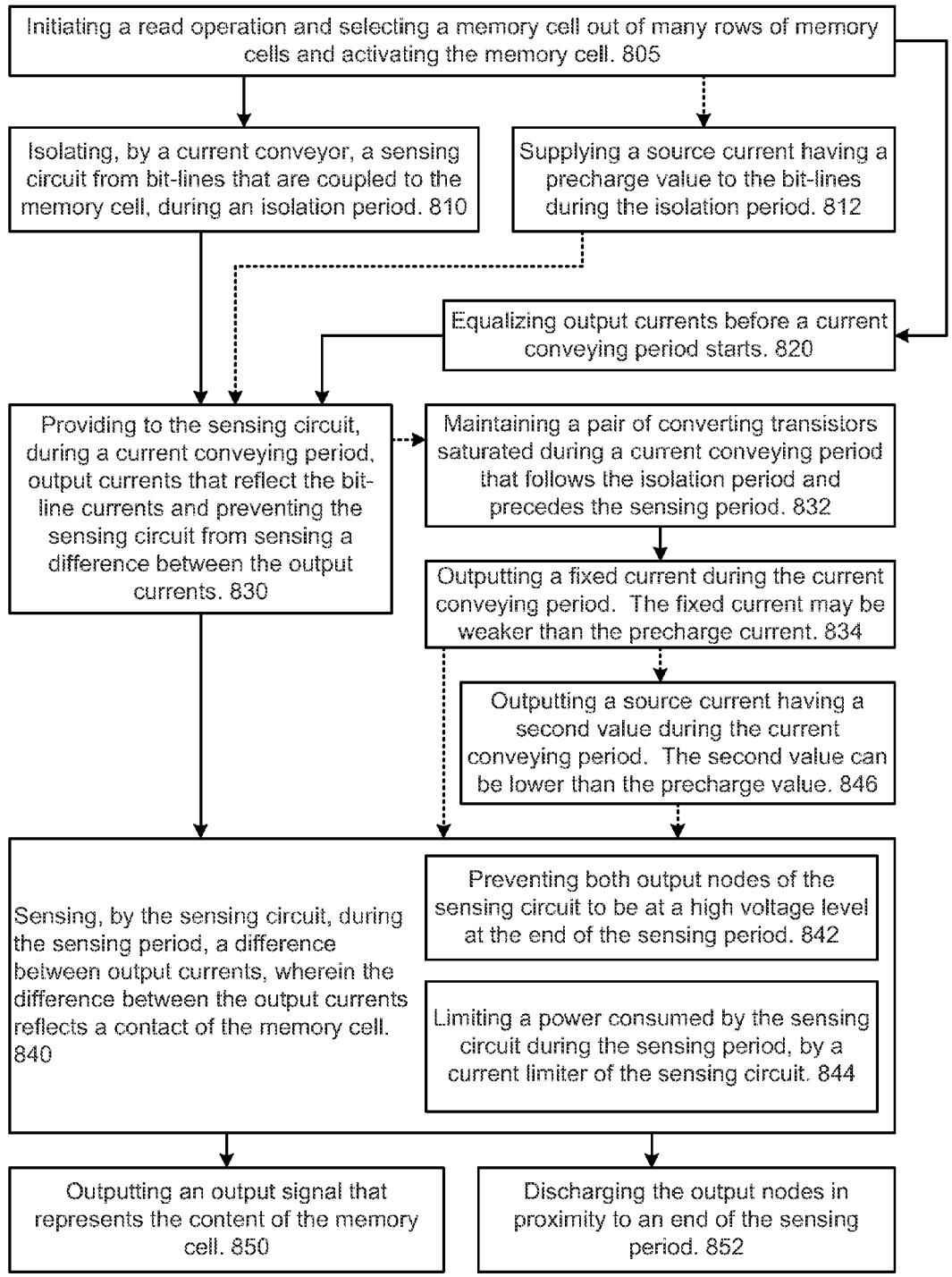
FIG. 5 schematically shows an example of an embodiment of a method for sensing a content of a memory cell.

FIG. 5 illustrates an example of a method 800 for sensing a content of a memory cell. Method 800 may be executed by device 10.

Method 800 starts by stage 805 of initiating a read operation and selecting a memory cell out of a many rows of memory cells and activating the memory cell.

Stage 805 is followed by stages 810 and 820, and may also be followed by stage 812.

Stage 810 includes isolating, by a current conveyor, a sensing circuit from bit-lines that are coupled to the memory cell, during an isolation period. During the isolation period the two output currents that are provided by a current conveyor to a sensing circuit can be equalized—as illustrated by stage 820. During the isolation period the bit-lines can be precharged to a desired state that should precede a sensing of the content of the memory cell. For example, the bit lines can be pre-charged to a 'high' state.

Method 800 may include stage 812 of supplying a source current having a precharge value to the bit-lines during the isolation period.

Stage 820 includes equalizing currents to be output before a current conveying period starts. Stage 820 may include equalizing the output currents before the current conveying period starts by an equalizer that is coupled to gates of current conveying transistors of the current conveyor. The isolation period is ended after stages 810 and 820 and is succeeded by the current conveying period.

Stages 810 and 820 are followed by stage 830 of providing to the sensing circuit, during a current conveying period, output currents that reflect the bit-line currents and preventing the sensing circuit from sensing a difference between the output currents. The current conveying period follows the isolation period and precedes a sensing period.

Method 800 may include stage 832 of maintaining a pair of converting transistors saturated during the current conveying period so that both output nodes of the sensing circuit are maintained at a low value. Stage 832 may be executed in parallel to stage 830.

Method 800 may include stage 834 of outputting a source current of a second value during the current conveying period. The second value can be lower than the precharge value.

After the current conveying period, a sensing period is started.

Stage 830 is followed by stage 840 of sensing, by the sensing circuit, during the sensing period, a difference between output currents, wherein the difference between the output currents reflects a content of the memory cell.

Stage 840 may include sensing a value of each output current. The values of the different output currents should differ from each other—one should be high and the second low. Stage 840 may include converting the difference between the output currents to a difference between voltage levels of two output nodes of the sensing circuit.

Stage 840 may be initiated at a point in time in which the difference between the output currents is expected to exceed a predetermined that is sufficient to detect a correct logic value.

Stage 840 can be initiated after a predetermined delay after the beginning of the current conveying period. The predetermined delay may be sufficient in order to facilitate a meaningful difference between the output currents to be developed.

Stage 840 may include stage 842 of preventing both output nodes of the sensing circuit to be at a high voltage level at the end of the sensing period—in order to prevent errors that may arise from the sensing of both output currents during the sensing period.

Stage 840 may also includes stage 844 of limiting a power consumed by the sensing circuit during the sensing period, by a current limiter of the sensing circuit. Stage 844 may include limiting currents that flow from a voltage source that feeds the sensing circuit to the ground by controlling a conductivity of a transistor that is located between the voltage source and the ground.

Method 800 may include stage 846 of outputting a source current of a second value during the current conveying period.

Stage 840 is followed by stage 850 outputting an output signal that represents the content of the memory cell. Stage 850 may include outputting an output signal that represents a value of one of the output currents. Stage 850 may include outputting two output signals that represents the values of the output currents. Stage 850 may include sending the output signal to a buffer.

Method 800 may include stage 852 of discharging the output nodes in proximity to an end of the sensing period.

In the foregoing specification, the invention has been described with reference to specific examples of embodiments of the invention. It will, however, be evident that various modifications and changes may be made therein without departing from the broader spirit and scope of the invention as set forth in the appended claims. For example, NMOS transistors can be replaced by PMOS transistors or by transistors of a different type, even by transistors that are not CMOS transistors.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "deassert" (or "negate" or "clear" or "reset") are used herein when referring to the rendering of a signal, status bit, or similar apparatus into its logically true and logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A memory device, comprising:
    a pair of bit-lines;
    a memory cell coupled between the pair of bit-lines;
    a sensing circuit having at least two inputs for receiving respective output currents from a current conveyor, said sensing circuit being arranged to sense, when operating in a sensing mode, a difference between said output currents, said difference between the output currents representing a content of the memory cell; and said sensing circuit comprising an output for outputting an output signal that represents the content of the memory cell; and
    said current conveyor, coupled to the pair of bit-lines and to the sensing circuit, for:
        isolating the sensing circuit from the bit-lines when the current conveyor is operated in an isolation mode, wherein a source current having a pre-charge value is provided to the memory cell when the current conveyor operated in the isolation mode, said current conveyor having at least two outputs for providing, to the sensing circuit when the sensing circuit operated in the sensing mode, output currents representing bit-lines currents, wherein a source current of a second value is provided when the sensing circuit operates in the sensing mode; wherein the second value is lower than the pre-charge value; and
        equalizing currents to be output as the output currents before the current conveyor starts to operate in a current conveying mode, wherein the sensing circuit enters the sensing mode after the current conveyor exits the current conveying mode.

2. The memory device according to claim 1, wherein the current conveyor comprises:
    current conveying transistors for providing the output currents to the sensing circuit, wherein the sensing circuit comprises a set of error prevention transistors for preventing both outputs to be at a high voltage level when the sensing circuit is operated in the sensing mode; and
    isolation transistors for isolating the sensing circuit from the bit-lines, when the current conveyor operated in the isolation mode.

3. The memory device according to claim 2, further comprising an equalizer, coupled to gates of the current conveying transistors, for equalizing the output currents before the current conveyor enters the current conveying mode.

4. The memory device according to claim 1, wherein the sensing circuit comprises a current limiter for limiting a power consumed by the sensing circuit when the sensing circuit operated in the sensing mode.

5. The memory device according to claim 1, wherein the sensing circuit comprises:
    a pair of converting transistors for converting the difference between the output currents to a difference between voltage levels of two output nodes of the sensing circuit; and
    a discharge circuit for discharging the output nodes in proximity to an end of an operation of the sensing circuit at the sensing mode.

6. The memory device according to claim 1, comprising a current source arranged to supply a source current having a precharge value to the memory cell when the current conveyor operates in an isolation mode and to output a source current having a second value that is lower than the precharge value when the sensing circuit operates in a sensing mode.

7. The memory device according to claim 1, wherein the sensing circuit comprises a control transistor for initiating a sensing of the difference between the output currents at a point in time in which the difference between the output currents is expected to exceed a threshold.

8. The memory device according to claim 1, wherein the current conveyor is configured to provide the output currents to the sensing circuit when the current conveyor operated in the current conveying mode; and wherein the sensing circuit is configured to be prevented from sensing the difference between the output currents when the current conveyor operated in the current conveying mode.

9. The memory device according to claim 1, comprising NMOS transistors that are coupled to two output nodes of the sensing circuits.

10. A memory device, comprising:
a pair of bit-lines;
a memory cell coupled between the pair of bit-lines;
a sensing circuit having at least two inputs for receiving respective output currents from a current conveyor, said sensing circuit being arranged to sense, when operating in a sensing mode, a difference between said output currents, said difference between the output currents representing a content of the memory cell; and said sensing circuit comprising an output for outputting an output signal that represents the content of the memory cell;
said current conveyor, coupled to the pair of bit-lines and to the sensing circuit, for:
isolating the sensing circuit from the bit-lines when the current conveyor operated in an isolation mode; said current conveyor having at least two outputs for providing, to the sensing circuit when the sensing circuit operated in the sensing mode, output currents representing bit-lines currents; and
a current source configured to supply a source current having a precharge value to the memory cell when the current conveyor operated in an isolation mode and to output a source current of a second value when the sensing circuit operates in a sensing mode; wherein the second value is lower than the precharge value.

11. A method for sensing a content of a memory cell, the method comprises:
isolating, by a current conveyor, a sensing circuit from bit-lines that are coupled to the memory cell, during an isolation period;
equalizing currents to be output as output currents before a current conveying period starts, wherein the current conveying period precedes a current sensing period and follows the isolation period;
providing, by a source current having a pre-charge value to the memory cell when the current conveyor operated in the isolation mode;
outputting a source current of a second value when the sensing circuit operates in the sensing mode, wherein the second value is lower than the pre-charge value;
providing, to the sensing circuit and during the sensing period, the output currents that represent bit-lines currents;
sensing, by the sensing circuit and during the sensing period, a difference between the output currents, wherein the difference between the output currents reflects a content of the memory cell; and
outputting an output signal that represents the content of the memory cell.

12. The method according to claim 11, comprising preventing both output nodes of the sensing circuit to be at a high voltage level at the end of the sensing period.

13. The method according to claim 11, comprising equalizing the output currents before the current conveying period starts by an equalizer that is coupled to gates of current conveying transistors of the current conveyor.

14. The method according to claim 11, comprising limiting a power consumed by the sensing circuit during the sensing period, by a current limiter of the sensing circuit.

15. The method according to claim 11, comprising:
converting the difference between the output currents to a difference between voltage levels of two output nodes of the sensing circuit; and
discharging the output nodes in proximity to an end of the sensing period.

16. The method according to claim 11, comprising maintaining converting transistors of the sensing circuit saturated during the current conveying period.

17. The method according to claim 11, comprising:
supplying a source current having a precharge value to the memory cell during the isolation period; and
outputting a source current of a second value during the sensing period; wherein the second value is lower than the precharge value.

18. The method according to claim 11, comprising initiating the sensing period at a point in time in which the difference between the output currents is expected to exceed a threshold.

19. The method according to claim 11, comprising:
providing the output currents to the sensing circuit during the current conveying period; and
preventing the sensing circuit from sensing the difference between the output currents during the current conveying period.

* * * * *